United States Patent [19]

Dale

[11] 3,883,946

[45] May 20, 1975

[54] METHODS OF SECURING A SEMICONDUCTOR BODY TO A SUBSTRATE

[75] Inventor: John Robert Dale, Salyfords near Redhill, England

[73] Assignee: U.S. Philips Corporation, New York, N.Y.

[22] Filed: June 13, 1972

[21] Appl. No.: 262,342

[30] Foreign Application Priority Data

June 17, 1971 United Kingdom .............. 28449/71

[52] U.S. Cl. .................. 228/121; 29/589; 228/123; 228/234; 228/249; 228/263

[51] Int. Cl. .......................................... B23k 31/02

[58] Field of Search .......... 29/473.1, 589, 590, 591, 29/472.9, 498

[56] References Cited

UNITED STATES PATENTS

| | | | |
|---|---|---|---|
| 3,228,104 | 1/1966 | Emeis | 29/589 X |
| 3,274,667 | 9/1966 | Sieberty | 29/589 X |
| 3,333,324 | 8/1967 | Roswell et al. | 29/589 UX |
| 3,581,386 | 6/1971 | Dole et al. | 29/589 X |
| 3,651,562 | 3/1972 | Hombleton | 29/473.1 |
| 3,657,611 | 4/1972 | Yoneda | 29/589 X |
| 3,729,807 | 5/1973 | Fujiwora | 29/472.9 X |

OTHER PUBLICATIONS

Soldering Manual prepared by AWS Committee on Brazing and Soldering, copyright 1959, pp. 5–24.

*Primary Examiner*—Francis S. Husar
*Assistant Examiner*—Ronald J. Shore
*Attorney, Agent, or Firm*—Frank R. Trifari

[57] ABSTRACT

A method of securing a semiconductor body to a substrate by pressure bonding wherein between substantially flat facing surfaces of the semiconductor body and substrate there is applied an intermediate malleable metal layer and a mechanical bond between the semiconductor body and the substrate via the intermediate layer is obtained by placing the assembly of the semiconductor body, intermediate metal layer and substrate in a press under a pressure of at least 1 ton per square inch and at most 5 tons per square inch while maintaining the assembly at a temperature which is below the melting point of the intermediate metal layer and is below the temperature at which any liquid phase would form by interaction of the elemental components of the intermediate metal layer, substrate and semiconductor body at the facing surfaces, said pressure and temperature being applied for obtaining the bond for a period of not more than 30 seconds.

33 Claims, 7 Drawing Figures

METHODS OF SECURING A SEMICONDUCTOR BODY TO A SUBSTRATE

This invention relates to methods of securing a semiconductor body to a substrate.

In the manufacture of semiconductor devices it is generally required to secure to a substrate a semiconductor body having regions comprising at least one circuit element. The substrate may serve as a heat sink for the semiconductor body and may also form an electrical contact to a region of the semiconductor body. Depending upon the size of the semiconductor body and the particular nature of the semiconductor device, the form of the substrate differs. For certain discrete semiconductor devices and integrated circuits the substrate to which the semiconductor device is secured may form a base part of an envelope in which the semiconductor body is encapsulated. In other devices, for example multi-element integrated circuits the substrate may form part of a support which carries other elements and and in turn is mounted on a further substrate. The semiconductor bodies of many semiconductor devices are in the form of small rectangular wafers which have been obtained by dicing from a larger disc-shaped wafer. For the purpose of the following prior art description these devices will be referred to generally as small devices. In other devices the semiconductor bodies are in the form of larger disc-shaped wafers having a diameter of at least 20 mm. Also for the purpose of the following prior art description these devices in which the semiconductor bodies consist of individual discs will be referred to generally as large devices. The latter class of large devices includes large scale integrated circuits in which a complex integrated circuit having several hundred or even several thousand interconnected circuit elements is formed in a disc-shaped wafer having, for example a diameter of 5 cms.

In the assembly of the small devices the most commonly employed methods of securing the semiconductor body to the support are eutectic bonding and direct soldering. In eutectic bonding, for example of silicon dice to copper header part of envelopes, an intermediate layer or preform of gold or gold/silicon is applied between the silicon die and the copper header. Generally the header is plated with gold and the surface of the die to be secured to the header has a metal plating. They are heated to a temperature of at least 377°C corresponding to the gold/silicon eutectic which forms a mechanically strong bond between the surfaces to be joined. This method although being perfectly satisfactory in many applications is not suitable where the semiconductor body of the device is unable to withstand exposure to a temperature corresponding to the gold/silicon eutectic. Also for devices in which the semiconductor body has a surface area of greater than 1 mm$^2$ the method is unsuitable, at least for metal substrates such as copper or iron, because the heating produces strain in the semiconductor body which leads to cracking. The use of an intermediate body of molybdenum between the semiconductor body and the substrate partially resolves these difficulties but leads to an increase in the complexity and cost of mounting the semiconductor body on the substrate. For large devices having a surface area greater than approximately 10 mm$^2$, the method of eutectic bonding is not at all suitable.

In the method of direct soldering, an intermediate solder layer is applied between the facing surfaces of the semiconductor body and substrate, this layer either being in the form of a separate solder body or in the form of a solder coating on at least one of the facing surfaces. Heating is effected to a temperature to melt the solder to cause it to wet the facing surfaces and on cooling forms a bond therebetween. This method is suitable for some small devices, provided steps are taken initially to apply various layers of metal to the facing surfaces to which the molten solder material will adhere. However for large devices the method may not be suitable because the bond may not be formed with a uniform material composition due to the trapping of occluded gases and the formation of various intermetallics at different areas.

For large devices having a semiconductor body in the form of a disc of a diameter greater than 20 mm, the most commonly used methods of securing the semiconductor body to the substrate are the method of attachment with a conductive epoxy resin and the method of hard and soft soldering. In the former case difficulties arise because in general the available conductive epoxy resins have a poor thermal resistance, uncertain reliability and may contaminate the device. In the method of hard and soft soldering very careful preparation of the semiconductor body is required. Generally the body surface which is to be secured to the substrate must be nickel plated which is then sintered in at the undesirably high temperature of 700°C. An intermediate layer of molybdenum or tungsten is also required. This method is complex and when used for joining silicon bodies to substrates the reject rate is high because cracking of the silicon frequently occurs.

Another proposed method of securing a semiconductor body to a support is diffusion bonding under pressure. In this method the semiconductor body and substrate are held under pressure at an elevated temperature for a period of several hours and a bond is produced between the facing surfaces due to the diffusion of the elemental components between the facing surfaces. In some methods an intermediate layer, for example of silver, is applied to one of the facing surfaces. This method although not involving melting of any of the components is not a useful production technique due to the long periods required to effect the bonding.

Another method in which pressure is employed is described in Japanese Pat. No. 15,966/60, where a silicon thin plate having an area of 1 cm$^2$, a gold foil also of 1 cm$^2$ area and of 0.02 mm thickness and a copper electrode base board are superposed. The assembly is placed under pressure at 150 kg/cm$^2$ at 370°C. Bonding is effected at the temperature of 370°C, whereas the normal gold/silicon eutectic temperature is 377°C, because the effect of the pressure lowers the eutectic temperature. Effectively this is a method in which melting occurs and suffers from the disadvantage that the temperatures required are high and of the same order as used in eutectic bonding with all the previously described disadvantages.

It is an object of the invention to provide an improved method of securing a semiconductor body to a support which can be used both for the said large devices and small devices, said method being relatively inexpensive in production cost and without the disadvantages attendant in the described prior art methods.

According to the invention there is provided a method of securing a semiconductor body to a substrate by pressure bonding wherein between substantially flat facing surfaces of the semiconductor body and substrate there is applied an intermediate malleable metal layer of soft solder material having a melting point in the range of 125° to 330°C. a mechanical bond is obtained between the semiconductor body and the substrate via the intermediate layer by placing the assembly of the semiconductor body, intermediate metal layer and substrate in a press under a pressure of at least 1 ton per square inch and at most 5 tons per square inch while maintaining the assembly at a temperature (in the range of 75° to 300°C) which is not only below the melting point of the intermediate metal layer but which is also below the temperature at which any liquid phase would form by interaction of the elemental components of the intermediate metal layer, substrate and semiconductor body at the facing surfaces, said pressure and temperature being applied for a period of not more than 30 seconds.

In this method a strong bond is achieved without the occurrence of the disadvantages mentioned in the previous discussiong of the prior art methods. The method in accordance with the invention utilizes high pressures, in fact higher than would normally appear to be acceptable for application to semiconductor bodies. It is a matter of some surprise that the application of such a high pressure does not cause fracture of the semiconductor body and the upper limit of 5 tons per square inch is chosen because for the commonly used semiconductor materials, for example silicon, pressures in excess of 5 tons per square inch may lead to fracture of the semiconductor material due to its low shear strength. The lower limit of 1 ton per square inch is chosen because it is found that pressures below this value do not yield a suitable bond or the bond obtained is of poor strength. The temperature at which bonding is effected may be relatively low in comparison to the temperatures employed in the prior art methods utilizing similar materials. The period of at most 30 seconds at which the said pressure and temperature are applied for obtaining the bond is relatively short and may be in many applications less than 5 seconds. This short bonding time coupled with the relatively simple means required to make the bond yields a relatively cheap production process. For any particular bonding operation the period during which the said pressure and temperature are applied is such that the bond achieves a desired tensile strength which is in general approximately 50 percent of the Ultimate Tensile Strength (UTS) of the malleable metal layer used. Sometimes, however, measurement of this is limited by the tensile strength, of the semiconductor body which if low will cause the semiconductor body to fracture before the bond is broken when under test. In some forms of the method where a high tensile strength bond is not required, the period during which the said temperature and pressure are applied may be such that the resultant bond has a tensile strength which is only 20 to 25 percent of the Ultimate Tensile Strength (UTS) of the malleable metal layer. When a bond strength of 50 percent of the Ultimate Tensile Strength (UTS) of the malleable metal layer is obtained, maintaining the assembly under the said pressure and temperature for a longer period will not appreciably increase the bond strength, that is it will not increase the bond strength by more than 20 percent. In the said case where the bond strength is only 20 to 25 percent of the Ultimate Tensile Strength (UTS) of the malleable metal layer, maintaining the assembly under the said pressure and temperature for a longer period will increase the bond strength but this is not desired.

The exact physical mechanism by which the bond is obtained is not fully understood. However the temperature conditions are such that no melting occurs of the intermediate layer at the facing surfaces and no liquid phase is formed by interaction of any of the components present. Furthermore with such a short period for the bonding time no long range diffusion of the elements takes place, although some short range diffusion, that is having a depth of a few atoms, may take place. Measurements of the bond strength obtained also indicate that the bonding is not due entirely to Van der Waal forces because the bond strength is too high to be accounted for solely by said forces.

The method of pressure bonding in accordance with the invention is not restricted to any undesirable upper limit of the area of the body as occurs with eutectic bonding (1 $mm^2$) and direct soldering for example to a copper substrate (approx. 4 $mm^2$) or to an iron substrate (approx. 6 $mm^2$). In fact the method may be employed with equal effect to the said small devices and the said larger devices, no upper limit on the area of the body having been found with any substrate material.

A further advantage of the method of pressure bonding in accordance with the invention is that compared with the prior art method of eutectic bonding any strain produced in the semiconductor body is minimal, mainly due to the lower temperatures that can be used in this method of pressure bonding thus reducing the effect of any difference in coefficients of expansion of the components and due to the fact that there is a small creepage of solder material in the lateral direction between the facing surfaces. The use of a malleable metal layer of soft solder enables the bonding to occur without the formation of intermetallics that would occur with conventional soldering and this is a contributory factor in the strain being low.

In the method in accordance with the invention it is found that the conditions of pressure and temperature are such that the deformation of the intermediate malleable metal layer is normally less than 5 percent, in many instances less than 2 percent, the deformation being the difference in thickness divided by the original thickness expressed as a percentage. Deformation is mentioned because in the known method of thermocompression bonding of an electrical lead conductor to a metal layer on a semiconductor surface the conditions of pressure and temperature are usually adjusted so that the deformation of the lead is between 10 percent and 30 percent. In comparison with this invention, thermocompression bonding usually involves higher pressures although only locally applied, and generally it is necessary in thermocompression bonding to use a temperature near the eutectic whereas in the pressure bonding method in accordance with the invention, the temperature may be significantly below, the eutectic temperature, by for example 50°C or more, below. It is found that bonding with a maximum pressure of 5 tons per square inch can be effected well below the eutectic temperature concerned.

In a preferred form of the method of pressure bonding in accordance with the invention the pressure applied lies within the range of 2.0 tons per square inch to 3.5 tons per square inch. This pressure range is effective for most of the specific materials of the intermediate malleable metal layer to be described hereinafter with the exception of some very low melting point solder materials as will also be described hereinafter.

The intermediate malleable metal layer may have various different forms. In one form it consists of a metal foil. In another form it consists of a metal coating which is applied to at least one of the facing surfaces. When the intermediate malleable metal layer consists of such a coating the choice of surface or surfaces on which it is applied and the coating thickness thereon will be determined by the materials of the semiconductor body and substrate.

The substrate may be of metal, for example of copper, molybdenum, iron, or an iron, nickel and cobalt alloy. The facing surface of the substrate may be provided with a metal coating of a material other than that of the intermediate malleable metal layer. For example when bonding a silicon body to a copper substrate using a soft solder foil, a thin gold coating may be applied initially to the facing surface of the copper substrate.

In another form of the method, the substrate, at least at the facing surface thereof, is of ceramic material, for example of beryllia, alumina or zirconia. The ceramic facing surface may be provided initially with a metal coating of a material other than the intermediate malleable metal layer. For example when bonding a silicon body to a beryllia substrate with a soft solder, a layer of gold or gold/palladium or silver/palladium may be applied by a conventional silk screen process for coating metal on ceramic surfaces. When using an intermediate malleable metal layer of indium it may not be necessary to apply a metal coating to the ceramic.

The intermediate malleable metal layer may be one of a range of soft solder materials having lead as the primary constituent and a melting point in the range of 300° to 327°C. One such material is of lead, silver and tin in which the percentages by weight respectively are 95, 3.5 and 1.5 and the melting point is 317°C. Another such material of the same constituents has respective percentages by weight of 95.5, 3.0 and 1.5, and a melting point of 306°C.

For pressure bonding a silicon body to a substrate of copper, thin iron an iron, nickel and cobalt alloy using one of said soft solders whose primary constituent is lead, a pressure of between 2.0 and 3.0 tons per square inch is suitable at a temperature of between 240° and 290°C. Preferably when using such soft solder materials for securing a silicon body to a substrate the facing surface of the silicon body has a thin metal coating, for example, a thin layer of titanium on the silicon and a thin layer of silver or gold on the titanium. Alternatively a this layer of gold may be applied to the silicon surface. When the substrate is of copper generally it is not necessary to apply any metal coating to the copper facing surface when using such lead based soft solder materials. However when using a substrate of an alloy of iron, nickel and cobalt, a thin coating of silver or nickel may be applied to the facing surface of the substrate. When using a substrate of steel, a thin gold coating may be applied to the facing surface, for example of 0.5 micron thickness. An advantage arises, by the use of the method in accordance with the invention, because for such a steel substrate, eutectic bonding would necessitate a much thicker gold layer, for example of at least 3.0 microns thickness.

The intermediate malleable metal layer may be one of a range of soft solder materials having as constituents for example, lead and tin, cadmium and tin, lead and indium, lead-tin and silver, or lead-cadmium and tin, and having melting points in the range of 150° to 300°C. Using such materials for the bonding of a silicon body to a support of copper or an alloy of iron, nickel and cobalt the pressure bond may be effected at a pressure of between 2.0 and 3.0 tons per square inch and at a temperature of between 100°C and 280°C depending upon the melting point. For example when using a solder of 60 percent by weight tin and 40 percent by weight lead (melting point 183°C) or a solder of 68 percent by weight tin and 32 percent by weight cadmium (melting point 177°C) bonding may be effected at 166°C. For solder compositions of lead and indium having melting points in the range of 235°–260°C bonding may be effected at a temperature in the range of 180°–200°C. When using a solder of 72 percent by weight lead and 28 percent by weight indium (melting point 260°C) for the bonding of a silicon body to a ceramic support, the bonding may be effected at a temperature of 190°–200°C at a pressure of approximately 3 tons per square inch. The possible application of metal coatings to the silicon body and/or substrate is similar to that described above for the soft solder materials based on lead and having melting points in the range of 300° to 327°C.

The intermediate malleable metal layer may be one of a range of soft solder materials having indium as the primary constituent and having melting points in the range of 125° to 160°C. When using such materials for the bonding of a silicon body to a substrate the pressure bond may be effected at a pressure between 1.0 and 1.5 tons per square inch and at a temperature, below the melting point of the intermediate malleable metal layer, in the range of 75°C to 150°C. For example when using a layer of pure indium (melting point 155°C) bonding may be effected at 125°C.

The dimensions of a soft solder foil body are chosen in accordance with the specific application of the method and the foil thickness may be as low as, for example, 2 microns and as high as, for example, 50 microns in thickness. A soft solder material may be applied as a coating on the semiconductor body and/or substrate by dip soldering, the total thickness of such a coating or coatings being, for example, approximately 10 microns.

Although specific reference has been made to the bonding of silicon bodies to a substrate, the method of pressure bonding in accordance with the invention may be employed with other semiconductor materials, for example germanium and gallium arsenide. For an n-type gallium arsenide body a film of tin followed by a film of gold may be applied to the facing surface of the gallium arsenide body prior to bonding to a substrate with an intermediate soft solder materials mentioned above.

The method may be employed for semiconductor bodies of various sizes. Generally the thickness should exceed 50 microns and the facing surface of the body bonded may be as low as 0.48 sq. mm. However for larger bodies the method has been found to be entirely suitable, it being possible to bond to a copper substrate a silicon disc of at least 7.5 cm diameter.

Several embodiments of the method of pressure bonding in accordance with the invention will now be described, by way of example, with reference to the accompanying diagrammatic drawings, in which.

Figure 4:
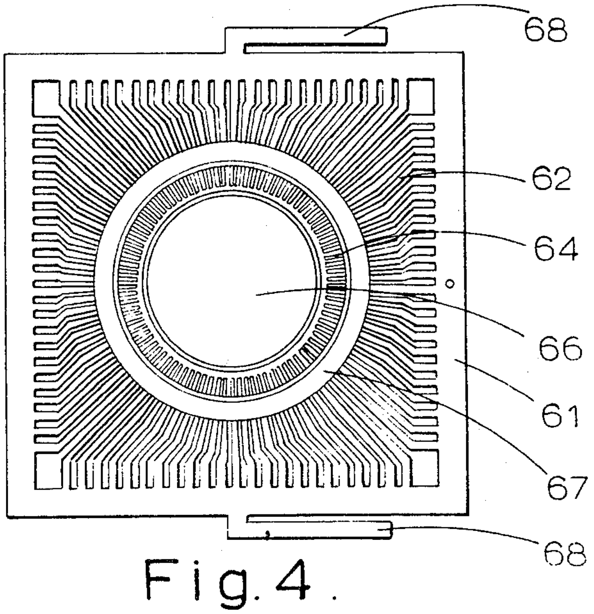
Figure 5:
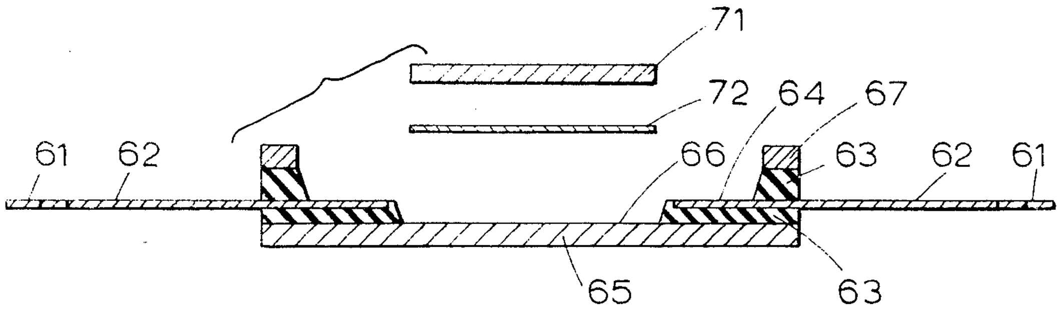
Figure 6:
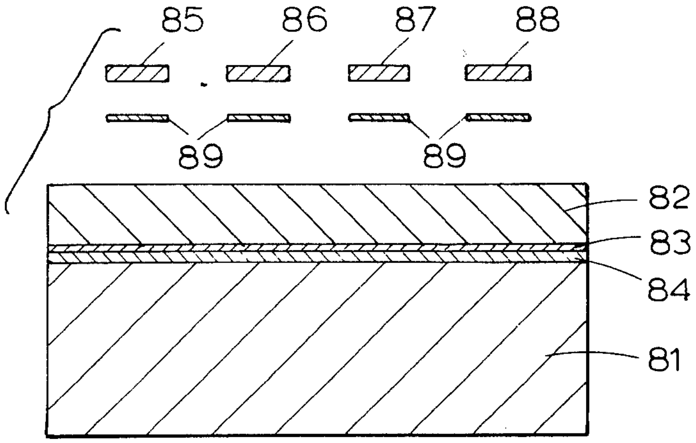
Figure 7:
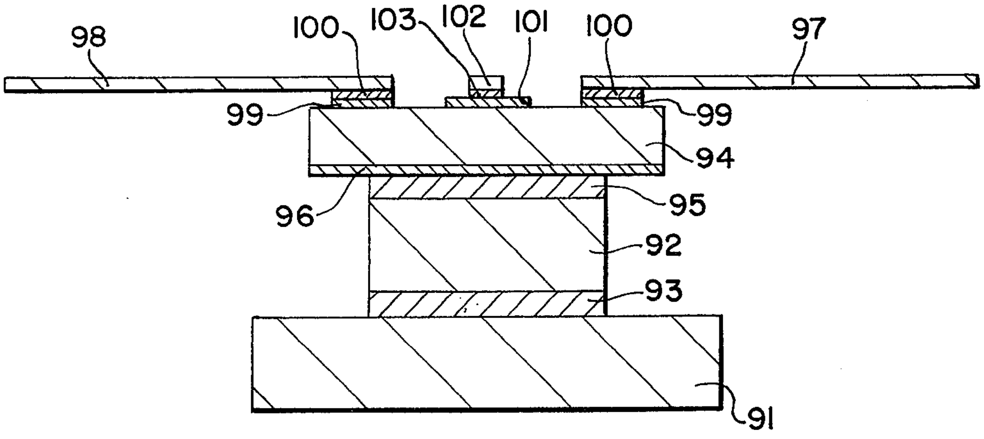

FIG. 4 shows a plan view of a multi-lead flat envelope for a large scale integrated circuit, and FIG. 5 shows in vertical section and in exploded form said part of the multi-lead envelope, an intermediate soft solder foil and a silicon wafer containing the circuit elements of a large scale integrated circuit, FIGS. 4 and 5 serving to illustrate a third embodiment in which the silicon wafer is pressure bonding to a base part of the multi-lead flat envelope via the intermediate soft solder foil;

FIG. 6 shows in vertical section and in exploded form a substrate having a ceramic surface part, a plurality of intermediate soft solder foil bodies and a corresponding plurality of silicon bodies and serves to illustrate a fourth embodiment in which the silicon bodies are pressure bonded to the ceramic supporting surface via the intermediate soft solder foil bodies; and FIG. 7 shows in vertical section a transmitting transistor module in which the transistor elements are pressure bonded on a ceramic supporting member via intermediate soft solder bodies and serves to illustrate a fifth embodiment.

Figure 1:
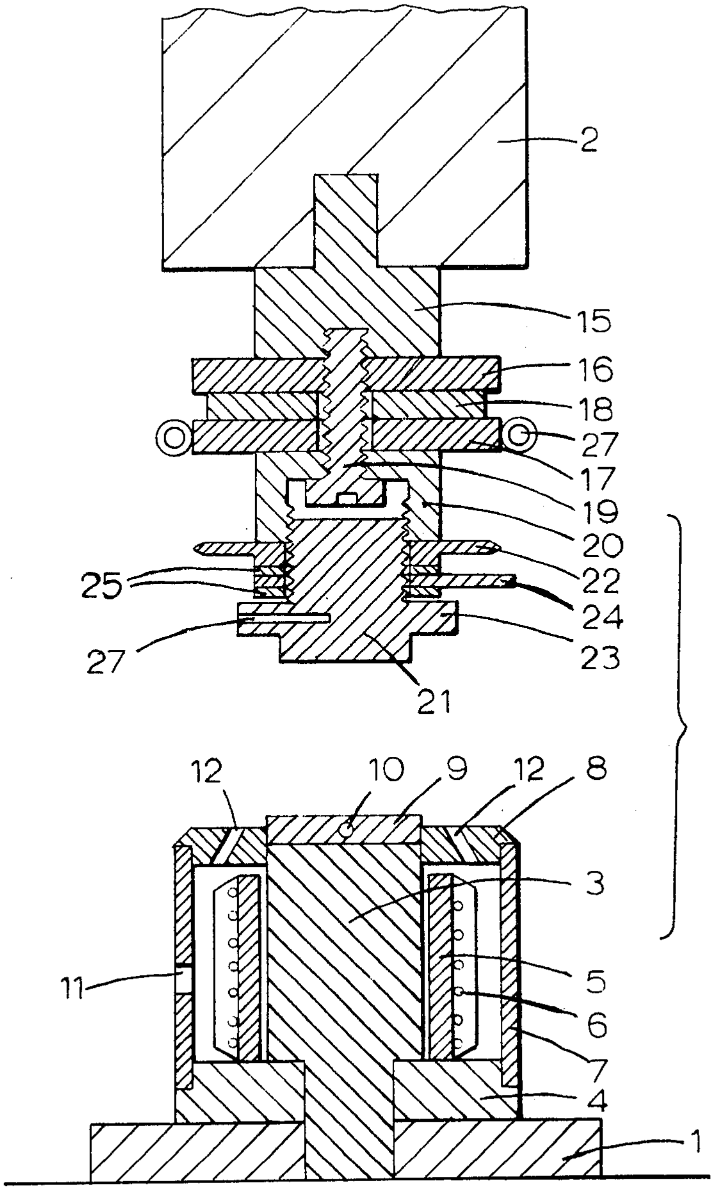
FIG. 1 is a vertical section of part of a press apparatus which may be employed in a method in accordance with the invention.

Referring first to FIG. 1, the press comprises a fixed steel supporting base 1 and a movable press head 2. A steel pedestal 3 of circular section is secured to the supporting base which also carries an asbestos support 4. On the asbestos support 4 there is a silica tube 5 which is coaxial with and surrounds the upper portion of the steel pedestal 3. A wire heater element 6 is wound around the silica tube 5. The heater element 6 and silica tube 5 are surrounded by an outer brass cover 7 which at its lower end is supported on the asbestos support 4 and at its upper end supports an asbestos cover 8. On the upper surface of the steel pedestal there is secured a steel support base 9 which is machined from material available from Kayser-Ellison as K.E. 970 tool steel which is a high duty tool steel which has been hardened and tempered. In the side of the support base 9 there is an aperture 10 for the insertion of a thermocouple (not shown). In the side wall of the outer brass cover 7 there is an opening 11 for inlet of mixed gas (10 percent hydrogen in nitrogen) to provde a controlled atmosphere around the components when being pressure bonded and to prevent oxidation of the tool faces. In the asbestos cover 12 there is a plurality of apertures for outlet of the gas.

The movable steel press head 2 has a steel insert 15 secured in its lower surface. Two steel plates 16 and 17 are secured to the insert 15 together with a rubber shock absorber pad 18 which is sandwiched between the plates 16 and 17. A bolt 19 secures the assembly of the plates 16 and 17 and the pad 18 to the insert 15, the head of the bolt 19 extending inside a steel cup member 20 which is loosely attached to the insert 15. The cup member 20 is internally threaded and locates an externally threaded end pressure plate 21 also of K.E. 970 tool steel. On the lower peripheral surface of the steel cup member 20 there is an asbestos insulator 22. The end pressure plate 21 has a peripheral rim 23 and between the rim 23 and the asbestos insulator 22 there is clamped a flat nichrome heater member 24 between two mica plates 25. The end pressure plate has an aperture 27 for insertion of a thermocouple element. The outer surface of the plate 17 has a water cooling tube attached thereto.

An example of the operation of the press apparatus in a method in accordance with the invention will now be described for the bonding of a semiconductor body to a substrate using a soft solder foil at a temperature of 165°C. With the movable press head 2 in the position shown in FIG. 1, the gas supply and heater elements 6 and 24 are switched on and the temperatures adjusted until the steel support base 9 and the end pressure plate 21 are at the desired bonding temperature, in this case 165°C. The assembly of the substrate, intermediate soft solder foil and semiconductor body is placed on the surface of the steel support base 9 and the movable press head 2 is lowered so that the end pressure plate 21 bears on the upper surface of the semiconductor body. The pressure of the end pressure plate 21 is then increased gradually over a period of 5 to 10 seconds until the desired bonding pressure is obtained, in this case 2.5 tons per square inch. This pressure is then maintained for the desired time, in this case approximately 10 seconds, and thereafter the pressure is released by upward movement of the press head 2 and finally the assembly of the semiconductor body bonded to the substrate via the intermediate soft solder foil is removed. Generally the heater elements 6 and 24 will be controlled to maintain the support base 9 and end pressure plate at the same temperature but these temperatures may if desired be varied independently. The control obtainable is ±2°C and is achieved via thermocouples in the apertures 10 and 27 and a temperature controller. The pressure and pressure build-up is controlled via a standard needle valve control and hydraulic clutch.

Figure 2:
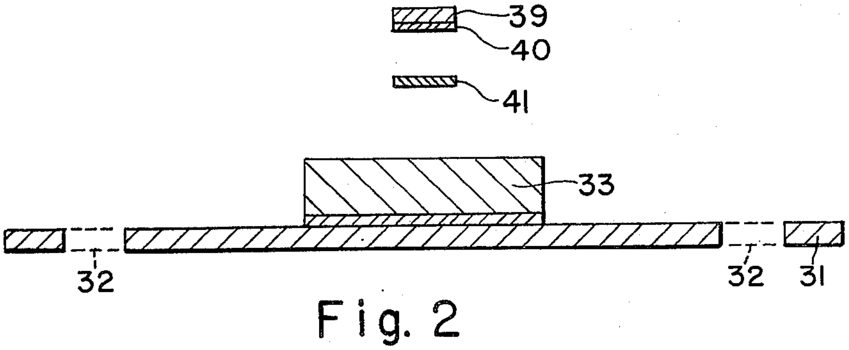
FIG. 2 shows in vertical section and in exploded form components consisting of a header part of an envelope, an intermediate soft solder foil and a silicon body and serves to illustrate a first embodiment in which the silicon body is pressure bonded to a copper part of the header via the intermediate soft solder foil.

With reference to FIG. 2 a first specific embodiment of the method of pressure bonding in accordance with the invention will now be described in which a silicon transistor chip is secured to a TO–3 outline header using an intermediate soft solder foil.

In this example, the TO–3 outline header consists of a steel base plate 31 of approximately 1 mm thickness having two mounting apertures 32. On the steel base plate 31 there has been secured by brazing a copper support member 33 in the form of a disc of 24 mm diameter and 2 mm thickness. Lead-in conductors extend through the mounting base 31 and member 33 via glass to metal seals but these are not shown in the section of FIG. 2. The surface of the copper support member 33 and also the remainder of the metal surface parts of the header have a gold plating of 0.5 micron thickness. In FIG. 2 there is also shown a silicon transistor body 39 of 2 mm × 2 mm × 250 microns thickness having a gold plating 40 of titanium (500A) and silver (0.5 micron) on its lower surface and an intermediate body 41 of 2.5 mm × 2.5 mm × 100 microns thickness consisting of a foil of a soft solder material, the constituents of which are lead, silver and tin, in percentages by weight of 95, 3.5 and 1.5 respectively.

The silicon transistor chip 39 is pressure bonded to the copper support member 33 via the intermediate soft solder foil body 41 using the apparatus shown in FIG. 1. The bonding temperature used is 240°C and the bonding pressure is 2.5 tons per square inch. The period during which the said pressure is applied is 10 seconds. The resultant bond strength is found to be 0.4 ton per square inch.

Figure 3:
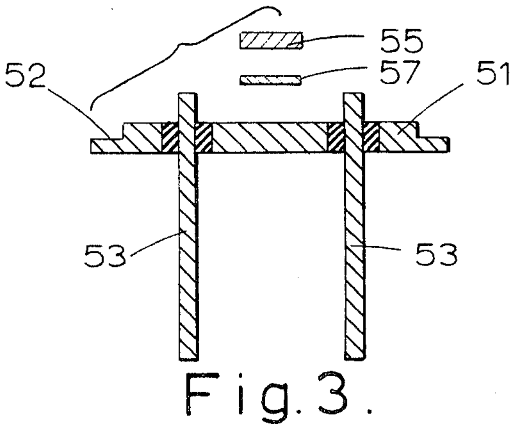
FIG. 3 shows in vertical section and in exploded form components consisting of a header part of an envelope, an intermediate soft solder foil and a silicon body and serves to illustrate a second embodiment in which the silicon body is pressure bonded to an iron part of the header via the intermediate soft solder foil.

With reference to FIG. 3 a second specific embodiment of the method of pressure bonding will now be described in which a silicon transistor chip is secured to a TO–5 outline header using an intermediate soft solder foil. In this example the TO–5 outline header consists of a base 51 of iron. The base 51 has an outer rim 52 for securing a hood thereon. Lead-in conductor wires 53, also of iron, extend through openings in the base 51 in which they are sealed with glass. The exposed surfaces of the base 51 and wires 53 all have a plating of gold of 0.2 micron thickness. In FIG. 3 there is also shown a silicon transistor chip 55 of 1.4 mm × 1.4 mm. × 250 microns thickness having a coating on the underside of gold of 500 A thickness and an intermediate foil body 57 of a solder having tin and lead as constituents, the percentages by weight being 60 and 40 respectively.

The silicon transistor chip 55 is pressure bonded to the iron header surface 51 via the intermediate foil body 57 as described in the previous embodiment, the temperature, pressure and time of maintaining the pressure respectively being 160°C, 2.0 tons per square inch and 5 seconds in this example. The bond strength obtained is approximately 0.4 ton per square inch.

As an alternative to the use of the tin/lead solder for the foil 57 in this embodiment, a solder of cadmium and tin may be used, the percentages by weight being 37 and 63 respectively and the melting point being 177°C. Using such a cadmium/tin solder for bonding the silicon ship 55 to the iron header 51, a temperature of 150°C may be employed at a pressure of 2.0 tons per square inch for a period of 5 seconds. This also yields a bond strength of 0.4 ton per square inch.

With reference to FIGS. 4 and 5 a third specific embodiment of the method of pressure bonding will now be described in which a large-scale integrated circuit wafer of silicon is secured to the base of a multi-lead flat envelope. The multi-lead flat envelope shown in FIGS. 4 and 5 comprises an outer member 61 of KOVAR of approximately 7.5 cm × 7.5 cm from which 92 lead-in conductors 62 extend. The lead-in conductors pass through an annular glass wall 63 of the envelope and their inner ends 64 are co-planar with a ledge portion of the glass wall 63. The glass wall 63 is sealed onto a disc-shaped metal base 65 of KOVAR which together with the glass wall 63 defines part of a substantially cylindrical enclosure within which a 3 cm in diameter circular part 66 of the inner surface of the metal base 65 is exposed. On the upper surface of the glass wall 63 there is a sealing ring 67, also of KOVAR for use in the subsequent attachment of a cover lid which seals the enclosure within the glass wall 63. The outer frame 61, which is eventually severed from the conductors 62, has two lugs for handling purposes. All the exposed KOVAR parts have a plating of gold of 0.5 micron thickness.

In the section of FIG. 5 there is also shown a silicon large scale integrated circuit wafer 71 of 2.8 cm diameter and 250 microns thickness having coatings of titanium and silver on its lower surface, and an intermediate foil member 72 of a solder of lead, silver and tin (95, 3.5, 1.5) of 50 microns thickness.

The silicon wafer 71 is pressure bonded to the gold plated surface 66 of the metal base 65 via the intermediate solder foil member 72 using the apparatus as shown in FIG. 1, the pressure applied being 3.0 tons per square inch at a temperature of 250°C for a total period of 30 seconds. The bond strength obtained is from 0.5 to 0.7 ton per square inch.

With reference to FIG. 6 a fourth specific embodiment of the method of pressure bonding will now be described in which a plurality of circuit elements are secured to a ceramic part of a mounting base. The mounting base comprises a copper member 81 of 12 mm × 12 mm and of 6 mm thickness to which is secured a member 82 of beryllia of 1 mm thickness. The beryllia member 82 on its lower surface has been provided with a coating layer 83 of silver and palladium of 6 microns thickness by a silk screen printing technique and has been pressure bonded to the copper member 82 using an intermediate solder foil layer 84.

The four elements 85, 86, 87, 88 consist of silicon transistor bodies each of 1.4 mm × 1.4 mm and 250 microns thickness. On their lower surfaces they have a plating of titanium (500 A) and silver (0.5 micron). The elements 85 to 88 simultaneously are pressure bonded to the upper surface of the beryllia disc 82 using intermediate solder foil bodies 89 of a lead/silver/tin solder in which the respective constituent percentages by weight are 95, 3.5 and 1.5 respectively. The dimensions of the foil bodies 89 are 1.4 mm × 1.4 mm × 50 microns thickness. The bonding pressure is 2.5 tons per square inch and the bonding temperature is 240°C, said pressure being maintained for a period of 20 seconds. Although a period of 20 seconds is quoted here it is found that for mass production purposes suitable bonds can be obtained at the same temperature and pressure in a period of 5 seconds.

With reference to FIG. 7 a fifth specific embodiment of the method of pressure bonding in accordance with the invention will now be described in which three transistor elements are secured on a conductive pattern applied on a ceramic member, the method being employed in the manufacture of a transmitting transistor module device comprising three transistor elements interconnected with passive circuit elements which are also provided on the same surface of the ceramic member.

The device shown in FIG. 7 comprises a rectangular copper base member 91 of 16 mm × 32 mm × 1.6 mm thickness plated with nickel and gold. A copper plinth 92 of 11 mm × 8 mm × 1.6 mm thickness also plated with nickel and gold is pressure bonded to the base 91 via an intermediate soft solder foil 93. A beryllia member 94 of 11 mm × 8 mm × 1.0 mm thickness is pressure bonded to the copper plinth via an intermediate solf solder foil 95. On the upper surface of the beryllia member 94 there is a screen printed conductive pattern of gold of approximately 15 microns thickness. On the lower surface of the beryllia member 94 there is a gold layer 96 of 15 microns thickness. Three lead-out conductor terminal strips of which two strips 97 and 98 are shown in the section of FIG. 7 are pressure bonded to connection pad portions 99 of the gold pattern at the upper surface of the beryllia member 94 via intermediate soft solder foil bodies 100. The terminal strips are of nickel of approximately 13 mm × 2 mm × 100 microns thickness plated with gold and extend laterally beyond the copper base 91. On each of three further pad portions of the gold pattern, of which only one such portion 101 is shown in the section of FIG. 7 there is secured a silicon transistor element 102 of 0.8 mm × 0.6 mm × 120 microns thickness. The elements 102 are secured to the gold pad portions 101 by pressure bonding via intermediate soft solder foil bodies 103 of approximately 0.6 mm × 0.8 mm × 40 microns thickness. All three transistor elements are pressure bonded simultaneously. The lower surfaces of the transistor bodies comprise a deposited layer of titanium having a deposited gold layer thereon. The method of pressure bonding used in securing the transistor elements 102 to the gold pads 101 on the beryllia member 94 involves the use of foil bodies 103 of a lead/indium solder of 72 percent by weight lead and 28 percent by weight indium, a bonding temperature of 190° to 200°C, a bonding presssure of 3.0 tons per square inch and a bonding time of 10 seconds.

After pressure bonding the three transistor elements 102, a plurality of passive circuit elements are secured on the surface of the beryllia member 94 with the aid of an adhesive, interconnections are established between the circuit elements and the conductive gold pattern and finally the device is encapsulated in silicone plastic leaving the three flat lead terminals projecting beyond the encapsulation. For the sake of clarity the passive circuit elements and the various interconnections are not shown in FIG. 7.

What we claim is:

1. A method of forming a bond between a substantially flat surface of a semiconductor body and a substantially flat surface of a substrate via an intermediate layer of soft solder material, said bond having a bond tensile strength of approximately 20 per cent or more of the Ultimate Tensile Strength of said intermediate layer, comprising the steps of:

positioning a malleable metal layer of soft solder material having lead as the primary constituent and a melting point within the range of 300° to 327°C between a flat surface of a semiconductor body and a flat surface of a substrate; and pressing said semiconductor body and substrate together at a pressure normal to said flat surfaces of between 1 and 5 tons per square inch at a temperature within the range of 240° to 290°C but below the melting point of said malleable metal layer at said pressure and suitably close to but below the lowest temperature at which a liquid phase forms at a surface of said malleable layer at said pressure, said temperature and pressure being maintained for a period sufficient to achieve a bond having a bond tensile strength of approximately 20 percent or more of the Ultimate Tensile Strength of said malleable layer, the maximum period required for such bonding being 30 seconds.

2. A method as defined in claim 1 wherein said temperature and pressure is maintained for no more than 30 seconds.

3. A method as defined in claim 2 wherein said temperature and pressure is maintained for no more than 5 seconds.

4. A method as defined in claim 1 wherein said pressure lies within the range of 2.0 to 3.5 tons per square inch.

5. A method as defined in claim 1 wherein said malleable layer is in the form of a metal foil.

6. A method as defined in claim 1 wherein said substrate, at least at said flat surface thereof, is ceramic material.

7. A method as defined in claim 6 wherein said flat surface of ceramic material is provided with a metallic coating of a material other than that of said malleable layer.

8. A method as defined in claim 1 wherein said malleable layer is deformed during said pressing step by less than 5 percent.

9. A method as defined in claim 1 wherein said substrate, at least at said flat surface thereof, is metallic material.

10. A method as defined in claim 9 wherein a metallic coating is provided on said flat surface of said metallic substrate of a material other than the materials of said metallic substrate and said malleable layer.

11. A method as defined in claim 1 wherein said substrate is of copper or iron or an iron, nickel and cobalt alloy.

12. A method of forming a bond between a substantially flat surface of a semiconductor body and a substantially flat surface of a substrate via an intermediate layer of soft solder material, said bond having a bond tensile strength of approximately 20 percent or more of the Ultimate Tensile Strength of said intermediate layer, comprising the steps of:

positioning a malleable metal layer of soft solder material having either lead and tin, cadmium and tin, lead and indium, lead-cadmium and tin, or lead-silver and tin as constituents and a melting point within the range of 150° to 300°C between a flat surface of a semiconductor body and a flat surface of a substrate; and pressing said semiconductor body and substrate together at a pressure normal to said flat surfaces of between 1 and 5 tons per square inch at a temperature within the range of 100° to 280°C but below the melting point of said malleable metal layer at said pressure and suitably close to but below the lowest temperature at which a liquid phase forms at a surface of said malleable layer at said pressure, said temperature and pressure being maintained for a period sufficient to achieve a bond having a bond tensile strength of approximately 20 percent or more of the Ultimate Tensile Stength of said malleable layer, the maximum period required for such bonding being 30 seconds.

13. A method as defined in claim 12 wherein said temperature and pressure is maintained for no more than 30 seconds.

14. A method as defined in claim 13 wherein said temperature and pressure is maintained for no more than 5 seconds.

15. A method as defined in claim 12 wherein said pressure lies within the range of 2.0 to 3.5 tons per square inch.

16. A method as defined in claim 12 wherein said malleable layer is in the form of a metal foil.

17. A method as defined in claim 12 wherein said substrate, at least at said flat surface thereof, is ceramic material.

18. A method as defined in claim 17 wherein said flat surface of ceramic material is provided with a metallic coating of a material other than that of said malleable layer.

19. A method as defined in claim 12 wherein said malleable layer is deformed during said pressing step by less than 5 percent.

20. A method as defined in claim 12 wherein said substrate, at least at said flat surface thereof, is metallic material.

21. A method as defined in claim 20 wherein a metallic coating is provided on said flat surface of said metallic substrate of a material other than the materials of said metallic substrate and said malleable layer.

22. A method as defined in claim 12 wherein said substrate is of copper or iron or an iron, nickel and cobalt alloy.

23. A method of forming a bond between a substantially flat surface of a semiconductor body and a substantially flat surface of a substrate via an intermediate layer of soft solder material, said bond having a bond tensile strength of approximately 20 percent or more of the Ultimate Tensile Strenth of said intermediate layer, comprising the steps of:

positioning a malleable metal layer of soft solder material having lead and indium as constituents and a melting point within the range of 235° to 260°C between a flat surface of a semiconductor body and a flat surface of a substrate; and pressing said semiconductor body and substrate together at a pressure normal to said flat surfaces of between 1 and 5 tons per square inch at a temperature within the range of 180° to 200°C but below the melting point of said malleable metal layer at said pressure and suitably close to but below the lowest temperature at which a liquid phase forms at a surface of said malleable layer at said pressure, said temperature and pressure being maintained for a period sufficient to achieve a bond having a bond tensile strength of approximately 20 percent or more of the Ultimate Tensile Strength of said malleable layer, the maximum period required for such bonding being 30 seconds.

24. A method as defined in claim 23 wherein said temperature and pressure is maintained for no more than 30 seconds.

25. A method as defined in claim 24 wherein said temperature and pressure is maintained for no more than 5 seconds.

26. A method as defined in claim 23 wherein said pressure lies within the range of 2.0 to 3.5 tons per square inch.

27. A method as defined in claim 23 wherein said malleable layer is in the form of a metal foil.

28. A method as defined in claim 23 wherein said substrate, at least at said flat surface thereof, is ceramic material.

29. A method as defined in claim 28 wherein said flat surface of ceramic material is provided with a metallic coating of a material other than that of said malleable layer.

30. A method as defined in claim 23 wherein said malleable layer is deformed during said pressing step by less than 5 percent.

31. A method as defined in claim 23 wherein said substrate, at least at said flat surface thereof, is metallic material.

32. A method as defined in claim 31 wherein a metallic coating is provided on said flat surface of said metallic substrate of a material other than the materials of said metallic substrate and said malleable layer.

33. A method as defined in claim 23 wherein said substrate is of copper or iron or an iron, nickel and cobalt alloy.

* * * * *

UNITED STATES PATENT OFFICE

CERTIFICATE OF CORRECTION

Patent No. 3,883,946 Dated May 20, 1975

Inventor(s) John Robert Dale

It is certified that error appears in the above-identified patent and that said Letters Patent are hereby corrected as shown below:

Column 1, line 21, "and in turn" should be --which in turn--

Column 3, line 7, "a" should be --A--

Column 5, line 47, "thin iron an iron, nickel" should be --iron or an iron, nickel-- line 56, "this" should be --thin--

Column 6, line 18, "166°C" should be --160°C--

Column 10, line 29, "The four elements" should be --The four circuit elements-- line 64, "solf" should be --soft

Signed and Sealed this

Seventh Day of June 1977

[SEAL]

*Attest:*

RUTH C. MASON
*Attesting Officer*

C. MARSHALL DANN
*Commissioner of Patents and Trademarks*